US006855630B1

(12) United States Patent
Ruf et al.

(10) Patent No.: US 6,855,630 B1
(45) Date of Patent: Feb. 15, 2005

(54) METHOD FOR MAKING CONTACT WITH A DOPING REGION OF A SEMICONDUCTOR COMPONENT

(75) Inventors: Alexander Ruf, Dresden (DE); Norbert Urbansky, Dresden (DE); Wilhelm Claussen, Dresden (DE); Thomas Gärtner, Ottendorf-Okrilla (DE); Sven Schmidbauer, Dresden (DE)

(73) Assignee: Infineon Technologies AG, Munich (DE)

( * ) Notice: Subject to any disclaimer, the term of this patent is extended or adjusted under 35 U.S.C. 154(b) by 26 days.

(21) Appl. No.: 10/614,430

(22) Filed: Jul. 7, 2003

Related U.S. Application Data

(63) Continuation of application No. PCT/DE01/04590, filed on Dec. 6, 2001.

(30) Foreign Application Priority Data

Jan. 4, 2001 (DE) .......................................... 101 00 178

(51) Int. Cl.⁷ ........................ H01L 21/44; H01L 21/336
(52) U.S. Cl. ........................ 438/655; 438/308; 438/652
(58) Field of Search ............................... 438/655, 652, 438/308, 581, 583, 592, 649, 651

(56) References Cited

U.S. PATENT DOCUMENTS

| | | | | |
|---|---|---|---|---|
| 4,545,116 A | * | 10/1985 | Lau | 438/647 |
| 4,701,349 A | | 10/1987 | Koyanagi et al. | |
| 5,434,044 A | * | 7/1995 | Nulman et al. | 438/653 |
| 5,639,678 A | | 6/1997 | Lee et al. | |
| 5,933,741 A | * | 8/1999 | Tseng | 438/305 |
| 6,001,729 A | * | 12/1999 | Shinriki et al. | 438/625 |
| 6,069,093 A | * | 5/2000 | Tada et al. | 438/761 |
| 6,071,782 A | * | 6/2000 | Maa et al. | 438/301 |
| 6,121,134 A | | 9/2000 | Burton et al. | |
| 6,228,667 B1 | * | 5/2001 | Cathey et al. | 438/20 |

OTHER PUBLICATIONS

Kaneko, H. et al.: "Novel Submicrometer MOS Devices by Self–Aligned Nitridation of Silicide", IEEE, Transactions on Electron Devices, vol. ED–33, No. 11, Nov. 1986, pp. 1702–1709.
Kamgar, A. et al.: "Self–Aligned TiN Barrier Formation by Rapid Thermal Nitridation of $TiSi_2$ in Ammonia", American Institute of Physics, J. Appl. Phys., vol. 66, No. 6, Sep. 15, 1989, pp. 2395–2401.
Inoue, K. et al.: "A New Cobalt Salicide Technology for 0.15– $\mu m$ CMOS Devices", IEEE Transactions on Electron Devices, vol. 45, No. 11, Nov., 11, 1998, pp. 2312–2318.
Chen, S. C. et al.: "Formation of Titanium Nitride/Titanium Silicide by High Pressure Nitridation in Titanium/Silicon", Japanese Journal of Applied Physics, vol. 30, No. 11A, Nov. 1991, pp. 2673–2678.
Tolia, A. et al.: "Integrated IMP Ti and MOCVD TiN for 300mm W Barrier and Liner for Sub 0.18 $\mu m$ IC Processing", SPIE, vol. 3883, Sep. 1999, pp. 130–136.

(List continued on next page.)

*Primary Examiner*—Matthew Smith
*Assistant Examiner*—Chuong Anh Luu
(74) *Attorney, Agent, or Firm*—Laurence A. Greenberg; Werner H. Stemer; Ralph E. Locher

(57) ABSTRACT

A method makes contact with a doping region formed at a substrate surface of a substrate. An insulating layer is applied on the substrate surface and a contact hole is formed in the insulating layer. A metal-containing layer is subsequently deposited on the insulating layer and the surface region of the doping region that is uncovered by the contact hole. In a subsequent thermal process having two steps, first the metal-containing layer is reacted with the silicon of the doping region to form a metal silicide layer and then the rest of the metal-containing layer is converted into a metal-nitride-containing layer in a second thermal step.

10 Claims, 2 Drawing Sheets

OTHER PUBLICATIONS

Kanamura, R. et al.: "Influence of the Sputtering Method of TiN/Ti Films on the Resistance of High Aspect Ration Contact Holes", VMIC Conference, Jun. 18–20, 1996, pp. 554–559.

Gambino, J. et al.: "Tungsten Contacts for a 256m DRAM Process Using a Thermally Formed TiN Diffusion Barrier", VMIC Conference, Jun. 18–20, 1996; pp. 180i–180k.

Dixit, G. A. et al.: "Ion Metal Plasma (IMP) Deposited Titanium Liners for 0.25/0.18 μm Multilevel Interconnections", IEEE, 1996, pp. 14.3.1–14.3.4.

Author not listed: "Physical Vapor Deposition Process BKM: Vectra IMP Ti", Applied Materials Inc., 2000, pp. 1–30.

Ermolieff, A. et al.: "Nitridation of Polycrystalline Titanium as Studied by in situ Angle–Resolved X–ray Photoelectron Spectroscopy", John Wiley & Sons, Ltd., Surface and Interface Analysis, vol. 11, Jan. 18, 1988, pp. 563–568.

* cited by examiner

US 6,855,630 B1

METHOD FOR MAKING CONTACT WITH A DOPING REGION OF A SEMICONDUCTOR COMPONENT

CROSS-REFERENCE TO RELATED APPLICATION

This application is a continuation of copending International Application No. PCT/DE01/04590, filed Dec. 6, 2001, which designated the United States and was not published in English.

BACKGROUND OF THE INVENTION

Field of the Invention

The present invention relates to a method for making contact with a doping region of a semiconductor component.

Semiconductor components are formed in a silicon substrate, for example. To that end, capacitors, resistors or transistors are formed, inter alia, in the semiconductor substrate. Furthermore, conductive regions are produced in the semiconductor substrate by the introduction of a dopant into the semiconductor substrate. The doped regions have an increased conductivity and are used as electrical terminals for the components formed in the semiconductor substrate. In subsequent processing steps, different doping regions are electrically connected to one another by interconnects.

The electrical wiring is usually formed in such a way that first an insulating layer is deposited on a surface of the semiconductor substrate and contact holes are subsequently formed in the insulating layer. The contact holes usually extend from the surface of the insulating layer as far as a surface of a doped region to be connected, the surface of the doped region to be connected being uncovered by the contact hole. A metal-containing layer, for example, is subsequently deposited on the insulating layer and in the contact hole on the doping region. Afterwards, a thermal step in a nitrogen-containing atmosphere is usually carried out, in the course of which two process aims are achieved simultaneously. First, a part of the metal-containing layer reacts with the silicon of the doping region to form a silicide layer and, second, the non-siliconized part of the metal-containing layer reacts to form a metal-nitride-containing layer.

The method steps specified above are disclosed for example in the reference titled "Nitridation of Polycrystalline Titanium As Studied By In Situ Angle-Resolved X-ray Photoelectron Spectroscopy", by A. Ermolieff et al., Surface and Interface Analysis, Vol. 11, p. 563–568 (1988); in the reference titled "Influence Of The Sputtering Method Of TiN/Ti Films On The Resistance Of High Aspect Ratio Contact Holes", by R. Kanamura et al., VMIC Conference Abstracts, p. 554–559 (1996); in the reference titled "Tungsten Contacts For 256M DRAM Process Using A Thermally Formed TiN Diffusion Barrier", by J. Gambino et al., VMIC Conference Abstracts, p. 180i–180k (1996); in the reference titled "Ion Metal Plasma (IMP) Deposited Titanium Liners For 0.25 and 0.18 μm Multilevel Interconnects", Proceedings of IEEE International Electron Devices Meeting, (1996) and in the reference titled "Integrated IMP Ti And MOCVD TiN For 300 mm W Barrier And Liners For Sub 0.18 μm IC Processing", Proceedings of SPIE, Volume 3883, p. 130–136, (1999).

What is disadvantageous about the known methods, however, is that the resistance at the bottom of the contact hole is formed with a relatively high value. This is due to the continually decreasing feature sizes in the semiconductor industry and the associated increase in the aspect ratio of the contact hole, which quantifies the ratio of contact hole depth to contact hole diameter.

One disadvantage of the prior art is that the silicide layer formed has an excessively thin thickness and, consequently, the electrical resistance when making contact with the doping region is relatively high. This leads to unacceptable delay times for example in the propagation time of electrical signals, as a result of which the electrical circuit and the component become unusable.

SUMMARY OF THE INVENTION

It is accordingly an object of the invention to provide an improved method for making contact with a doping region of a semiconductor component that overcomes the above-mentioned disadvantages of the prior art methods of this general type.

With the foregoing and other objects in view there is provided, in accordance with the invention, a method for making and contacting a doping region of a semiconductor component. The method includes providing a silicon substrate having a substrate surface, introducing a dopant into the silicon substrate resulting in the doping region being formed at the substrate surface in the substrate, and depositing and patterning an insulating layer on the substrate surface, a surface region of the doping region being uncovered. A metal-containing layer is the deposited on the insulating layer and the surface region. The substrate is processed during a first step in a process chamber at a first temperature in a first atmosphere containing $H_2$, for a first time duration, resulting in metal silicide being produced from a part of the metal-containing layer and a part of the doping region. Subsequently, the substrate is further processed during a second step at a second temperature in a second atmosphere containing less than 10% $H_2$ and more than 90% $N_2$, for a second time duration to convert a remaining part of the metal-containing layer into metal nitride.

According to the invention, two thermal steps are carried out in a first atmosphere, which contains $H_2$ (hydrogen) or argon, the first thermal step advantageously being suitable for first reacting a part of the deposited metal-containing layer with the silicon of the doping region to form a silicide layer, which enables a low-resistance contact with the doping region. The first and second atmospheres contain the inert gases $H_2$ or argon. Hydrogen has the positive property, for example, that it is possible to anneal defects in a substrate during a hydrogen heat treatment. By virtue of the increased proportion of hydrogen during the second thermal step in a second atmosphere, which likewise contains hydrogen or argon, the remaining part of the metal-containing layer is converted into a metal-nitride-containing layer. In this case, the metal-nitride-containing layer has the advantage that it acts as a diffusion barrier for dopants and contaminants. Equally, it acts as a diffusion barrier for reactive gases during subsequent steps such as a tungsten deposition or as a diffusion barrier for metal layers with high diffusion in silicon, such as aluminum, for example.

A further advantage of the method according to the invention is that the thickness of the silicide layer formed and the thickness of the metal-nitride-containing layer formed can be set independently of one another by the two independent thermal steps. This increases the process flexibility and enables a reduced electrical resistance when making contact with the doping region.

An advantageous refinement of the method according to the invention provides for the first time duration to be shorter than the second time duration.

A further method step provides for the metal-containing layer to contain titanium, tantalum, cobalt, molybdenum, palladium, platinum, nickel or tungsten. These metals are suitable for forming a metal silicide layer.

It is furthermore provided that the metal-containing layer is deposited by an ionized metal plasma method—at a temperature of between 180° C. and 220° C. and preferably at 200°+/−5° C. Ionized metal plasma deposition methods are advantageously suitable for depositing metal ions on the bottom of a contact hole with a large aspect ratio by use of the directional method. Consequently, the metal-containing layer is deposited on the surface region of the doping region with an increased layer thickness and an improved conformity. This advantageously leads to a reduced contact resistance.

It is furthermore provided that the uncovered surface region is cleaned using a wet-chemical cleaning process. The wet-chemical cleaning has the advantage that insulating layers that are possibly present are removed from the surface region of the doping region. This results in a reduced contact resistance.

In accordance with an added mode of the invention, during the first step, the processing of the substrate is carried out at a temperature of 550° C., and the first atmosphere contains $N_2$ with a proportion of less than 25%.

In accordance with a further mode of the invention, during the second step, the second atmosphere contains a proportion of 4% $H_2$ and a proportion of 96% $N_2$, and the processing of the substrate is carried out at a second temperature of 550° C.

Other features which are considered as characteristic for the invention are set forth in the appended claims.

Although the invention is illustrated and described herein as embodied in a method for making contact with a doping region of a semiconductor component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED
EMBODIMENTS

Figure 1:
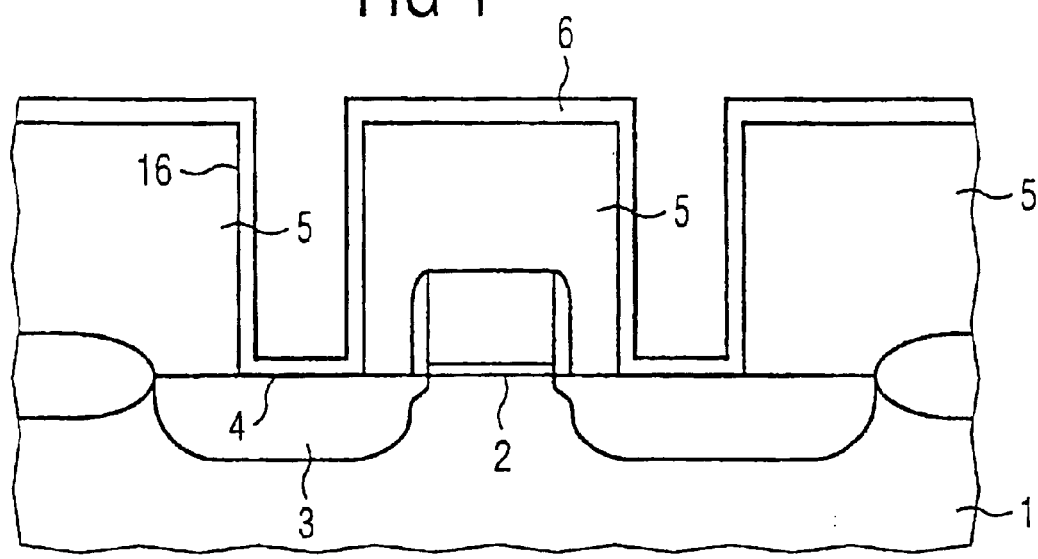
FIG. 1 is a diagrammatic, sectional view of a substrate with a doping region, a contact hole and a metal-containing layer according to the invention.

Referring now to the figures of the drawing in detail and first, particularly, to FIG. 1 thereof, there is shown a substrate 1 having a substrate surface 2. A doping region 3 is disposed at the substrate surface 2 in the substrate 1. An insulating layer 5 is disposed on the substrate surface 2. A contact hole 16 is formed in the insulating layer 5. The contact hole 16 uncovers a surface region 4 of the doping region 3. A metal-containing layer 6 is disposed on the insulating layer 5 and the uncovered surface region 4.

A method for forming the configuration illustrated in FIG. 1 first forms the doping region 3 in the substrate 1 by an implantation process. To that end, by way of example, a dopant is introduced through the substrate surface 2 into the substrate 1, and this can be carried out for example by an ion implantation process. The insulating layer 5 is subsequently deposited by a chemical vapor deposition (CVD) method, for example. The insulating layer 5 is, for example, a doped silicate glass such as borophosphosilicate glass (BPSG). The doping region 3 may be made n-conducting or p-conducting, depending on the dopants used. Examples of suitable dopants are boron, phosphorus and arsenic. The substrate 1 may likewise be formed as a p-doped or n-doped substrate. A subsequent method step forms a mask on the insulating layer 5, which is suitable for patterning the insulating layer 5, by a photolithographic and an etching step. The mask may be formed from a silicon nitride. The contact hole 16 is subsequently etched into the insulating layer 5 by a directional etching method. In this case, the contact hole 16 is formed into the insulating layer 5 to an extent such that the surface region 4 of the doping region 3 is uncovered. A cleaning step for cleaning the surface region 4 is subsequently carried out. A wet-chemical and isotropic etching method is suitable for this purpose. The metal-containing layer 6 is subsequently formed on the insulating layer 5 and the uncovered surface region 4 by an ionized metal plasma deposition. This is a plasma-enhanced sputtering method in which ionized metal particles with a directional component are deposited on the surface region 4 of the doping region 3. The ionized metal plasma process is carried out at a temperature of 200° C., for example.

Figure 2:
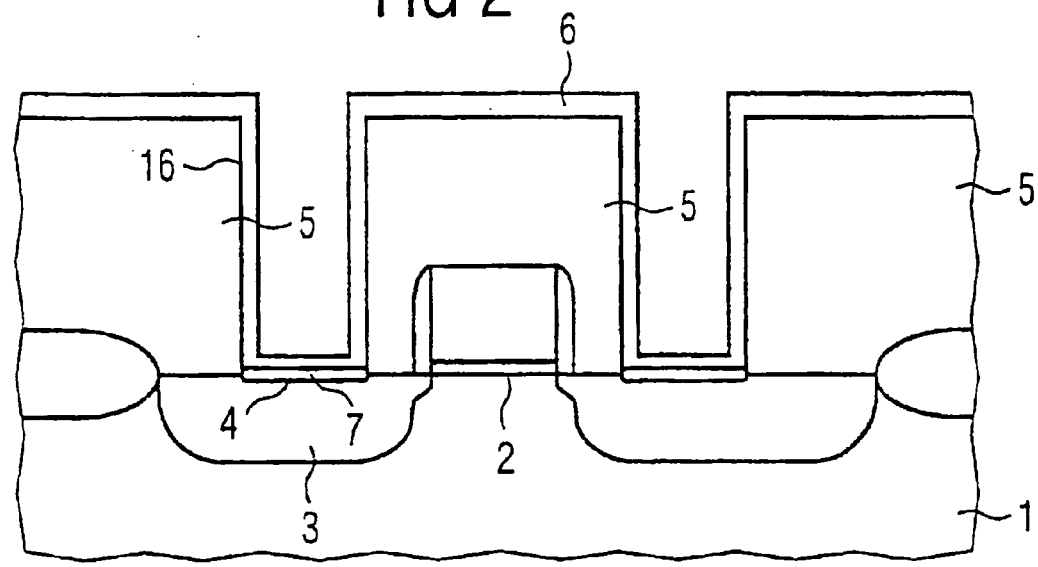
FIG. 2 is a sectional view showing the configuration from FIG. 1 with a metal silicide layer having been formed.

With reference to FIG. 2, a metal silicide layer 7 is formed between the doping region 3 and the metal-containing layer 6. The metal silicide layer 7 is formed in a process chamber at a first temperature in a first atmosphere for a first time duration. If the metal-containing layer 6 contains titanium, then a process at a temperature of 550° C. in a hydrogen-containing atmosphere with a time duration of 5 minutes is suitable for forming the metal silicide layer 7 as a titanium silicide layer. In this case, the proportion of nitrogen in the atmosphere is advantageously kept low. The proportion of nitrogen is preferably less than 25%.

Furthermore, a process step in a rapid thermal processing (RTP) furnace is suitable for forming the metal silicide layer 7. To that end, the substrate 1 is heated at a temperature of 600° C. in a hydrogen-containing atmosphere for 10 seconds.

Figure 3:
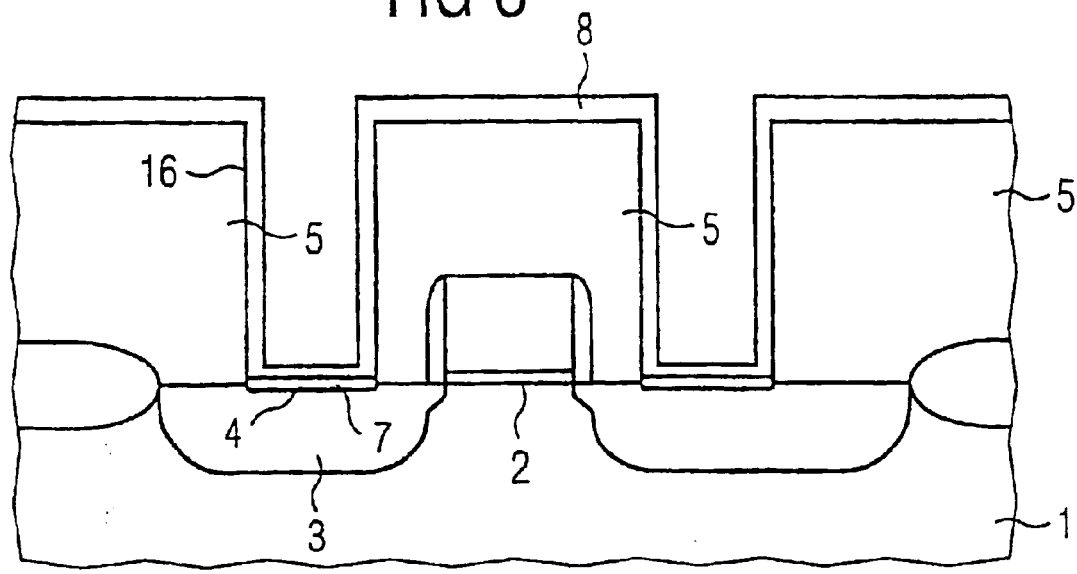
FIG. 3 is a sectional view showing the configuration in accordance with FIG. 2, the metal-containing layer having been converted into a metal-nitride-containing layer.

With reference to FIG. 3, the metal-containing layer 6 has been converted into a metal-nitride-containing layer 8. This is achieved by processing the substrate 1 in a process chamber at a second temperature in a second atmosphere for a second time duration. If the metal-containing layer 6 is a titanium-containing layer, then a titanium-nitride-containing layer 8 can be formed at a temperature of 550° C. in a forming gas atmosphere with 4% hydrogen and 96% nitrogen proportion with a time duration of 20 minutes. Furthermore, an RTP process step at a temperature of 600° C. in a forming gas atmosphere with 4% hydrogen and 96% nitrogen proportion for a second time duration of 50 seconds is suitable for forming the titanium-nitride-containing layer 8.

Furthermore, a thermal step in a process chamber at a temperature of 550° C. in an atmosphere with 10% hydrogen and 90% nitrogen for a time duration of 25 minutes is suitable for forming a titanium silicide layer and a titanium nitride layer.

Figure 4:
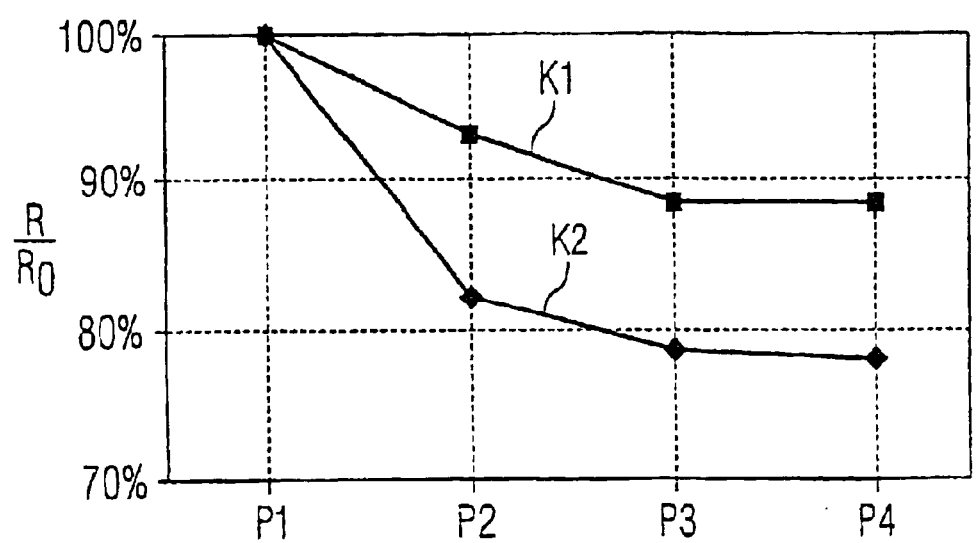
FIG. 4 is a graph showing the relative resistance when making contact with a doping region for four different fabrication methods.

FIG. 4 illustrates the relative resistance for four different processing methods P1, P2, P3 and P4 for in each case two different sputtering methods for forming the metal-containing layer 6. The first curve K1 links the sputtering deposition methods for the metal-containing layer formed by an ionized metal plasma deposition. The curve K2 links points at which the metal-containing layer 6 was formed by a standard sputtering method.

The method P1 carries out a single-step thermal step at a temperature of 550° C. in an atmosphere with 4% hydrogen and 96% nitrogen for a time duration of 25 minutes. In this case, it is evident that the curve K1 and the curve K2 produce the same resistance value. As a basis of comparison for the other process implementations P2 to P4, the resistance of the process implementation P1 is used as a reference value with 100%.

The process implementation P2 first carries out a first thermal step for 10 minutes in a hydrogen-containing atmosphere at 550° C. A thermal step at a temperature of 550° C. for 15 minutes in a forming gas atmosphere with 4% hydrogen and 96% nitrogen is subsequently carried out. For the ionized sputtering method, the resistance has fallen to about 93%, and, for the standard sputtering method, the resistance has fallen to about 82% of the original resistance.

This results in an advantage of the thermal process method according to the invention over the standard method.

The thermal process sequence P3 provides for a thermal step at 550° C. in a hydrogen-containing atmosphere for a time duration of 20 minutes to be carried out first of all. A thermal process at a temperature of 550° C. and with a time duration of 5 minutes in a forming gas atmosphere with 4% hydrogen and 96% nitrogen is subsequently carried out. The method P3 leads to a reduction of the resistance to about 88% for the ionized sputtering method and 79% for the standard sputtering method.

The process sequence P4 provides for a thermal step to be carried out for a time duration of 25 minutes at a temperature of 550° C. in a hydrogen-containing atmosphere. This results in a reduction to 88% of the original resistance for the ionized sputtering method and to 78% of the original resistance for the standard sputtering method. However, the method P4 does not carry out nitridation of the metal-containing layer 6, so that no nitride barrier is formed.

We claim:

1. A method for making and contacting a doping region of a semiconductor component, which comprises the steps of:

providing a silicon substrate having a substrate surface;

introducing a dopant into the silicon substrate resulting in the doping region being formed at the substrate surface in the substrate;

depositing and patterning an insulating layer on the substrate surface, a surface region of the doping region being uncovered;

depositing a metal-containing layer on the insulating layer and the surface region;

processing the substrate during a first step in a process chamber at a first temperature in a first atmosphere containing $H_2$, for a first time duration, resulting in metal silicide being produced from a part of the metal-containing layer and a part of the doping region; and subsequently processing the substrate during a second step at a second temperature in a second atmosphere containing less than 10% $H_2$ and more than 90% $N_2$, for a second time duration to convert a remaining part of the metal-containing layer into metal nitride.

2. The method according to claim 1, which further comprises setting the first time duration to be shorter than the second time duration.

3. The method according to claim 1, which further comprises forming the metal-containing layer from a material selected from the group consisting of titanium, tantalum, cobalt, molybdenum, palladium, platinum, nickel and tungsten.

4. The method according to claim 1, which further comprises using an ionized metal plasma method at a temperature between 180° C. and 220° C. for depositing the metal-containing layer.

5. The method according to claim 1, which further comprises using a wet-chemical cleaning process for cleaning the uncovered surface region.

6. The method according to claim 1, which further comprises using an ionized metal plasma method at a temperature of 200° C.±5° C. for depositing the metal-containing layer.

7. The method according to claim 1, which further comprises during the first step, carrying out the processing of the substrate at a temperature of 550° C.

8. The method according to claim 1, which further comprises during the first step, forming the first atmosphere to contain N2 with a proportion of less than 25%.

9. The method according to claim 1, which further comprises during the second step, forming the second atmosphere to contain a proportion of 4% $H_2$ and a proportion of 96% $N_2$.

10. The method according to claim 9, which further comprises during the second step, carrying out the processing of the substrate at the second temperature being S50° C.

* * * * *